US012601805B2

(12) United States Patent
Fu

(10) Patent No.: US 12,601,805 B2
(45) Date of Patent: Apr. 14, 2026

(54) DYNAMIC CONTRAST-ENHANCED MAGNETIC RESONANCE IMAGING RECONSTRUCTION METHOD AND APPARATUS, AND MAGNETIC RESONANCE IMAGING SYSTEM

(71) Applicant: Siemens Healthineers AG, Forchheim (DE)

(72) Inventor: Cai Xia Fu, Shanghai (CN)

(73) Assignee: Siemens Healthineers AG, Forchheim (DE)

( * ) Notice: Subject to any disclaimer, the term of this patent is extended or adjusted under 35 U.S.C. 154(b) by 160 days.

(21) Appl. No.: 18/646,989

(22) Filed: Apr. 26, 2024

(65) Prior Publication Data

US 2024/0361410 A1     Oct. 31, 2024

(30) Foreign Application Priority Data

Apr. 28, 2023   (CN) ......................... 202310488314.X

(51) Int. Cl.
*G01R 33/56*          (2006.01)
*G01R 33/563*         (2006.01)

(52) U.S. Cl.
CPC ..... *G01R 33/5601* (2013.01); *G01R 33/5608* (2013.01); *G01R 33/56308* (2013.01)

(58) Field of Classification Search
CPC ............ G01R 33/5601; G01R 33/5608; G01R 33/56308
See application file for complete search history.

(56) References Cited

U.S. PATENT DOCUMENTS

| | | | |
|---|---|---|---|
| 9,251,584 B2 * | 2/2016 | Calcagno-Mani | ........................... G01R 33/4818 |
| 11,016,159 B2 * | 5/2021 | Hu | ...................... G01R 33/5611 |
| 11,079,455 B2 * | 8/2021 | Okell | ............... G01R 33/56366 |

* cited by examiner

*Primary Examiner* — Gregory H Curran
(74) *Attorney, Agent, or Firm* — Banner & Witcoff, Ltd.

(57)          ABSTRACT
A dynamic contrast-enhanced MRI reconstruction method may include: when preparing to inject a contrast agent and during injection thereof, using a DCE-MRI sequence to scan an imaging target, and using a high temporal resolution scanning parameter value pre-inputted by a user to acquire K-space data of each phase with high temporal resolution; based on the acquired K-space data of each phase with high temporal resolution, reconstructing an image of each phase with high temporal resolution; based on a low temporal resolution reconstruction parameter value pre-inputted by the user, subjecting adjacent K-space data of multiple phases with high temporal resolution to summing and averaging in a complex field, and subjecting K-space data obtained after averaging to image reconstruction, to obtain an image of each phase with low temporal resolution. Advantageously, images with high and low temporal resolution can be obtained simultaneously with just a single DCE-MRI scan.

18 Claims, 3 Drawing Sheets

101   using a DCE-MRI sequence to scan an imaging target 102   reconstructing an image of each phase with high temporal resolution 103   summing and averaging adjacent K-space data and performing image reconstruction to obtain a LTR image 101    using a DCE-MRI sequence to scan an imaging target 102    reconstructing an image of each phase with high temporal resolution 103    summing and averaging adjacent K-space data and performing image reconstruction to obtain a LTR image

300

DYNAMIC CONTRAST-ENHANCED MAGNETIC RESONANCE IMAGING RECONSTRUCTION METHOD AND APPARATUS, AND MAGNETIC RESONANCE IMAGING SYSTEM

CROSS REFERENCE TO RELATED APPLICATIONS

This patent application claims priority to Chinese Patent Application No. 202310488314X, filed Apr. 28, 2023, which is incorporated herein by reference in its entirety.

BACKGROUND

Technical Field

The present disclosure relates to the technical field of MRI (Magnetic Resonance Imaging), in particular a DCE (Dynamic Contrast-Enhanced)-MRI reconstruction method and apparatus, and an MRI system.

Related Art

DCE-MRI can quantitatively assess tissue blood vessel generation and functions thereof, so as to indicate, at the level of cell molecular function, physiological information such as tissue blood vessel distribution and perfusion. After rapid intravenous injection of a paramagnetic contrast agent, the contrast agent rapidly permeates into blood vessels and extravascular extracellular space, affecting the resonant frequency of adjacent protons, and shortening T1 (longitudinal relaxation time); at the same time, a fast MRI sequence is used to perform continuous dynamic scanning of a selected layer, and the time variation of signal strength of each pixel point in this layer is observed. A pharmacokinetic model is fitted to obtain a graph of signal strength against time, thereby obtaining semi-quantitative parameters and quantitative parameters. The permeation effect of the contrast agent in a region of interest is quantified, so as to indicate hemodynamic information such as blood vessel permeation and perfusion in pathological tissue, and assess physiological and functional changes in tissue.

In the case of conventional DCE-MRI used for quantitative calculation of perfusion, data with high temporal resolution is collected when preparing to inject the contrast agent and during injection thereof, and a small amount of data is used to reconstruct an image of each phase. Based on the reconstructed image, quantitative information relating to perfusion is calculated, such as the reflux rate constant (Kep) and the constant of transfer (Ktrans) of contrast agent between the plasma space and the extravascular extracellular space in tumor tissue, etc. However, both the signal-to-noise (SNR) ratio and the spatial resolution of the reconstructed image obtained in this way are very low, and the image quality is low. In some situations, it is necessary to be able to see morphological information in images more clearly, and the requirements for image signal-to-noise ratio and resolution are higher. In this case, the following approach is generally adopted: after an interval of time, once the contrast agent in the patient's body has been metabolized, more contrast agent is injected into the patient, and data with low temporal resolution is collected during injection of the contrast agent, so as to obtain an image with a high signal-to-noise ratio and high spatial resolution. This is very time-consuming, and spoils the patient experience.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
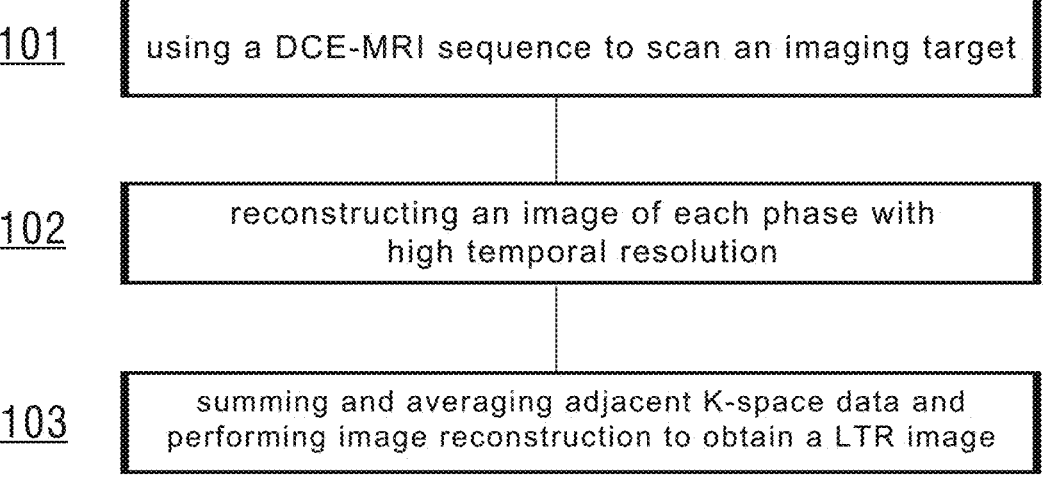
FIG. 1 is a flowchart of a DCE-MRI reconstruction method according to an exemplary embodiment of the present disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

In view of the above, embodiments of the present disclosure propose, in one aspect, a DCE-MRI reconstruction method and apparatus, to enable images with high temporal resolution and low temporal resolution to be obtained simultaneously by performing only one DCE-MRI scan; and in another aspect, propose an MRI system, to enable images with high temporal resolution and low temporal resolution to be obtained simultaneously by performing only one DCE-MRI scan.

A dynamic contrast-enhanced magnetic resonance imaging reconstruction method may include:

when preparing to inject a contrast agent and during injection thereof, using a dynamic contrast-enhanced magnetic resonance imaging (DCE-MRI) sequence to scan an imaging target, and using a high temporal resolution scanning parameter value pre-inputted by a user to acquire K-space data of each phase with high temporal resolution;

based on the acquired K-space data of each phase with high temporal resolution, reconstructing an image of each phase with high temporal resolution;

based on a low temporal resolution reconstruction parameter value pre-inputted by the user, in combination with the high temporal resolution scanning parameter value used when acquiring K-space data of each phase with high temporal resolution, subjecting adjacent K-space data of multiple phases with high temporal resolution to summing and then averaging in a complex field, and subjecting K-space data obtained after averaging to image reconstruction, to obtain an image of each phase with low temporal resolution.

The step of using a high temporal resolution scanning parameter value pre-inputted by a user to acquire K-space data of each phase with high temporal resolution, may comprise:

using a high temporal resolution scanning parameter value pre-inputted by a user and a preset K-space data filling method and acceleration method, to acquire K-space data of each phase with high temporal resolution, wherein the filling method is: Cartesian filling or radial filling or spiral filling, and the acceleration method is: one or any combination of half-Fourier acquisition, parallel acquisition, multi-layer simultaneous acquisition, and compressed sensing sparse acquisition.

The step of reconstructing an image of each phase with high temporal resolution, may comprise:

determining a reconstruction method according to the filling method and acceleration method used when acquiring K-space data of each phase with high temporal resolution, and using the determined reconstruction method to reconstruct an image of each phase with high temporal resolution;

the step of subjecting K-space data obtained after averaging to image reconstruction, comprises:

determining a reconstruction method according to the filling method and acceleration method used when acquiring K-space data of each phase with high temporal resolution, and using the determined reconstruction method to subject K-space data obtained after averaging to image reconstruction.

The step of subjecting adjacent K-space data of multiple phases with high temporal resolution to summing and then averaging in a complex field, may comprise:

subjecting adjacent K-space data of multiple phases with high temporal resolution to summing and then averaging in a complex field after phase correction and motion registration.

The high temporal resolution scanning parameter value pre-inputted by the user may be: an acquisition time interval of two adjacent phases when acquiring K-space data with high temporal resolution, and the acquisition time interval of two adjacent phases pre-inputted by the user remains unchanged throughout the period of acquiring K-space data with high temporal resolution, or increases as the delay time after contrast agent injection increases throughout the period of acquiring K-space data with high temporal resolution.

The low temporal resolution reconstruction parameter value pre-inputted by the user may be: a time interval of two adjacent phases of a reconstructed low temporal resolution image, and the time interval of two adjacent phases of the reconstructed low temporal resolution image pre-inputted by the user remains the same in all reconstructed low temporal resolution phases, or increases as the delay time after contrast agent injection increases.

A dynamic contrast-enhanced magnetic resonance imaging reconstruction apparatus may include:

a K-space data acquisition module, configured to use a dynamic contrast-enhanced magnetic resonance imaging (DCE-MRI) sequence to scan an imaging target, and use a high temporal resolution scanning parameter value pre-inputted by a user to acquire K-space data of each phase with high temporal resolution, when preparing to inject a contrast agent and during injection thereof;

a high temporal resolution image reconstruction module, configured to reconstruct an image of each phase with high temporal resolution, based on the acquired K-space data of each phase with high temporal resolution;

a low temporal resolution image reconstruction module, configured to subject adjacent K-space data of multiple phases with high temporal resolution to summing and then averaging in a complex field, based on a low temporal resolution reconstruction parameter value pre-inputted by the user, in combination with the high temporal resolution scanning parameter value used when acquiring K-space data of each phase with high temporal resolution, and subject K-space data obtained after averaging to image reconstruction, to obtain an image of each phase with low temporal resolution.

The K-space data acquisition module using a high temporal resolution scanning parameter value pre-inputted by a user to acquire K-space data of each phase with high temporal resolution, may comprise:

using a high temporal resolution scanning parameter value pre-inputted by a user and a preset K-space data filling method and acceleration method, to acquire K-space data of each phase with high temporal resolution, wherein the filling method is: Cartesian filling or radial filling or spiral filling, and the acceleration method is: one or any combination of half-Fourier acquisition, parallel acquisition, multi-layer simultaneous acquisition, and compressed sensing sparse acquisition.

The high temporal resolution image reconstruction module reconstructing an image of each phase with high temporal resolution, may comprise:

determining a reconstruction method according to the filling method and acceleration method used when acquiring K-space data of each phase with high temporal resolution, and using the determined reconstruction method to reconstruct an image of each phase with high temporal resolution;

the low temporal resolution image reconstruction module subjecting K-space data obtained after averaging to image reconstruction, comprises:

determining a reconstruction method according to the filling method and acceleration method used when acquiring K-space data of each phase with high temporal resolution, and using the determined reconstruction method to subject K-space data obtained after averaging to image reconstruction.

The low temporal resolution image reconstruction module subjecting adjacent K-space data of multiple phases with high temporal resolution to summing and then averaging in a complex field, may comprise: subjecting adjacent K-space data of multiple phases with high temporal resolution to summing and then averaging in a complex field after phase correction and motion registration.

The high temporal resolution scanning parameter value pre-inputted by the user and used by the K-space data acquisition module may be: an acquisition time interval of two adjacent phases when acquiring K-space data with high temporal resolution, and the acquisition time interval of two adjacent phases pre-inputted by the user remains unchanged throughout the period of acquiring K-space data with high temporal resolution, or increases as the delay time after contrast agent injection increases throughout the period of acquiring K-space data with high temporal resolution.

The low temporal resolution reconstruction parameter value pre-inputted by the user and used as a basis by the low temporal resolution image reconstruction module may be: a time interval of two adjacent phases of a reconstructed low temporal resolution image, and the time interval of two adjacent phases of the reconstructed low temporal resolution image pre-inputted by the user remains the same in all reconstructed low temporal resolution phases, or increases as the delay time after contrast agent injection increases.

A magnetic resonance imaging (MRI) system may include the dynamic contrast-enhanced magnetic resonance imaging reconstruction apparatus as described in any one of the embodiments above.

In embodiments of the present disclosure, the high temporal resolution scanning parameter value is used when acquiring K-space data, and images with high temporal resolution and low temporal resolution are reconstructed simultaneously according to the acquired K-space data; in this way, images with high temporal resolution and low temporal resolution can be obtained simultaneously with just a single DCE-MRI scan.

FIG. 1 is a flowchart of a DCE-MRI reconstruction method provided in an embodiment of the present disclosure, the specific steps thereof being as follows:

Step 101: when preparing to inject a contrast agent and during injection thereof, using a DCE-MRI sequence to scan an imaging target, and using a high temporal resolution scanning parameter value pre-inputted by a user to acquire K-space data of each phase with high temporal resolution.

In an exemplary embodiment, the high temporal resolution scanning parameter value pre-inputted by the user is: an acquisition time interval of two adjacent phases when acquiring K-space data with high temporal resolution, and the acquisition time interval of two adjacent phases pre-inputted by the user remains unchanged throughout the period of acquiring K-space data with high temporal resolution, or increases as the delay time after contrast agent injection increases throughout the period of acquiring K-space data with high temporal resolution.

For example, in order to be able to calculate perfusion-related quantitative information more accurately, a smaller acquisition time interval may be set in an initial stage of acquisition of K-space data with high temporal resolution, and subsequently a larger acquisition time interval may be set. For example: let the total K-space data acquisition time with high temporal resolution be 6 minutes; then within 1 minute of beginning to inject a contrast agent, the acquisition time interval of two adjacent phases is set as 3 s; within the period of 1-2 minutes after beginning to inject the contrast agent, the acquisition time interval of two adjacent phases is set as 6 s; within the period of 2-3 minutes after beginning to inject the contrast agent, the acquisition time interval of two adjacent phases is set as 10 s; and within the period of 3-6 minutes after beginning to inject the contrast agent, the acquisition time interval of two adjacent phases is set as 15 s.

In an exemplary embodiment, the step of using a high temporal resolution scanning parameter value pre-inputted by a user to acquire K-space data of each phase with high temporal resolution, comprises: using a high temporal resolution scanning parameter value pre-inputted by a user and a preset K-space data filling method and acceleration method, to acquire K-space data of each phase with high temporal resolution, wherein the filling method is: Cartesian filling or radial filling or spiral filling, etc., and the acceleration method is: one or any combination of half-Fourier acquisition, parallel acquisition, multi-layer simultaneous acquisition, compressed sensing sparse acquisition, etc.

Step 102: based on the acquired K-space data of each phase, reconstructing an image of each phase with high temporal resolution.

In an exemplary embodiment, the step of reconstructing an image of each phase with high temporal resolution, comprises: determining a reconstruction method according to the filling method and acceleration method used when acquiring K-space data of each phase with high temporal resolution, and using the determined reconstruction method to reconstruct an image of each phase with high temporal resolution. The reconstruction method may be: one or any combination of half-Fourier reconstruction, parallel reconstruction, compressed sensing iterative reconstruction, deep learning reconstruction, etc.

Step 103: based on a low temporal resolution reconstruction parameter value pre-inputted by the user, in combination with the high temporal resolution scanning parameter value used when acquiring K-space data of each phase with high temporal resolution, subjecting adjacent K-space data of multiple phases with high temporal resolution to summing and then averaging in a complex field, and subjecting K-space data obtained after averaging to image reconstruction, to obtain an image of each phase with low temporal resolution.

In an exemplary embodiment, the low temporal resolution reconstruction parameter value pre-inputted by the user is: a time interval of two adjacent phases of a reconstructed low temporal resolution image, and the time interval of two adjacent phases of the reconstructed low temporal resolution image pre-inputted by the user remains the same in all reconstructed low temporal resolution phases, or increases as the delay time after contrast agent injection increases.

In an exemplary embodiment, the step of subjecting adjacent K-space data of multiple phases with high temporal resolution to summing and then averaging in a complex field, comprises: subjecting adjacent K-space data of multiple phases with high temporal resolution to summing and then averaging in a complex field after phase correction and motion registration.

In an exemplary embodiment, the step of subjecting K-space data obtained after averaging to image reconstruction, comprises: determining a reconstruction method according to the filling method and acceleration method used when acquiring K-space data of each phase with high temporal resolution, and using the determined reconstruction method to subject K-space data obtained after averaging to image reconstruction. The reconstruction method may be: one or any combination of half-Fourier reconstruction, parallel reconstruction, compressed sensing iterative reconstruction, deep learning reconstruction, etc.

In an exemplary embodiment, when the high temporal resolution scanning parameter value in step 101 is the acquisition time interval of two adjacent phases when acquiring K-space data with high temporal resolution, and the low temporal resolution reconstruction parameter value in step 103 is the time interval of two adjacent phases of the reconstructed low temporal resolution image, the acquisition time interval of two adjacent phases when acquiring K-space data with high temporal resolution in step 101 is less than the time interval of two adjacent phases of the reconstructed low temporal resolution image in step 103.

In the above embodiments, the high temporal resolution scanning parameter value is used when acquiring K-space data, and images with high temporal resolution and low temporal resolution are reconstructed simultaneously according to the acquired K-space data; in this way, images with high temporal resolution and low temporal resolution can be obtained simultaneously with just a single DCE-MRI scan. The high temporal resolution image has a lower SNR ratio, and may be used to calculate perfusion-related quantitative information such as the reflux rate constant (Kep) and the constant of transfer (Ktrans) of contrast agent between the plasma space and the extravascular extracellular space in tumor tissue; the low temporal resolution image has a higher SNR ratio, and can provide more morphological information.

Figure 2:
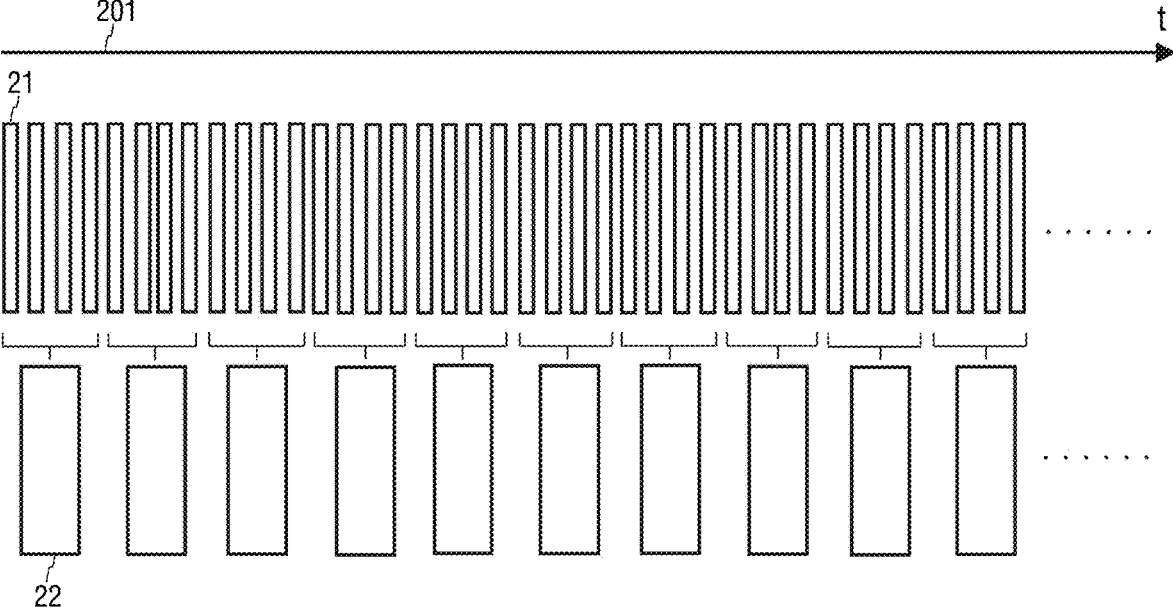
FIG. 2 shows an example of a DCE-MRI reconstruction process according to an exemplary embodiment of the present disclosure.

FIG. 2 shows an example of a DCE-MRI reconstruction process provided in the present disclosure. As shown in FIG. 2, in this example, the user-inputted high temporal resolution scanning parameter value is an acquisition time interval 4 s (seconds) of two adjacent phases when acquiring K-space data with high temporal resolution, and the user-inputted low temporal resolution reconstruction parameter value is a time interval 16 s of two adjacent phases of the reconstructed low temporal resolution image. wherein:

201 is the moment when injection of the contrast agent begins, wherein 21 represents K-space data of 1 phase with high temporal resolution, and 22 represents K-space data of 1 phase with low temporal resolution; as can be seen, 1 phase with low temporal resolution corresponds to 4 phases with high temporal resolution. Based on the acquired K-space data of each phase with high temporal resolution, an image of each phase with high temporal resolution is reconstructed; based on the acquired K-space data of every 4 phases with high temporal resolution, an image of each phase with low temporal resolution is reconstructed, i.e.: the acquired K-space data of every 4 phases with high temporal resolution is subjected to summing and then averaging in a complex field after phase correction and motion registration, and K-space data obtained after averaging is subjected to image reconstruction, to obtain an image of each phase with low temporal resolution.

Figure 3:
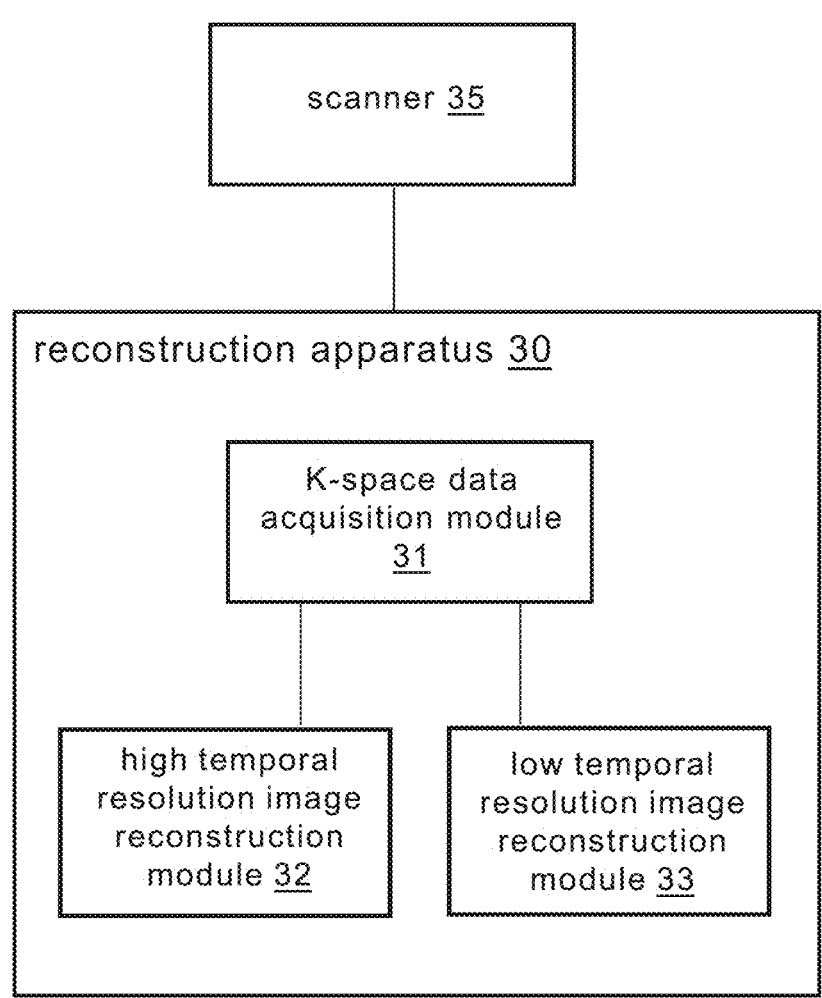
FIG. 3 is a schematic diagram of a MRI system, including a DCE-MRI reconstruction apparatus, according to an exemplary embodiment of the present disclosure.

FIG. 3 is a structural schematic diagram of a DCE-MRI reconstruction apparatus 30 provided in an embodiment of the present disclosure, the apparatus 30 mainly comprising: a K-space data acquisition module 31, a high temporal resolution image reconstruction module 32 and a low temporal resolution image reconstruction module 33, wherein:

The K-space data acquisition module 31 is configured to use a DCE-MRI sequence to scan an imaging target, and use a high temporal resolution scanning parameter value pre-inputted by a user to acquire K-space data of each phase with high temporal resolution, when preparing to inject a contrast agent and during injection thereof. The reconstruction apparatus 30 may include processing circuitry that is configured to perform one or more functions and/or operations of the reconstruction apparatus 30. One or more components of the reconstruction apparatus 30 (e.g., space data acquisition module 31, high temporal resolution image reconstruction module 32, and/or low temporal resolution image reconstruction module 33) may include processing circuitry that is configured to perform one or more respective functions and/or operations of the component(s). The reconstruction apparatus 30 may be a controller or other processing device, and may be a component of an MRI system. In an exemplary embodiment, the reconstruction apparatus 30 may include one or more processors and a memory storing instructions. When the one or more processors executes the instructions, the reconstruction apparatus 30 performs one or more functions or operations of the reconstruction apparatus 30, such as to perform the method discussed with reference to FIG. 1. The high temporal resolution image reconstruction module 32 is configured to reconstruct an image of each phase with high temporal resolution, based on the K-space data of each phase with high temporal resolution acquired by the K-space data acquisition module 31.

The low temporal resolution image reconstruction module 33 is configured to subject adjacent K-space data of multiple phases with high temporal resolution acquired by the K-space data acquisition module 31 to summing and then averaging in a complex field, based on a low temporal resolution reconstruction parameter value pre-inputted by the user, in combination with the high temporal resolution scanning parameter value used by the K-space data acquisition module 31 when acquiring K-space data of each phase with high temporal resolution, and subject K-space data obtained after averaging to image reconstruction, to obtain an image of each phase with low temporal resolution.

In an exemplary embodiment, the K-space data acquisition module 31 using a high temporal resolution scanning parameter value pre-inputted by a user to acquire K-space data of each phase with high temporal resolution, comprises: using a high temporal resolution scanning parameter value pre-inputted by a user and a preset K-space data filling method and acceleration method, to acquire K-space data of each phase with high temporal resolution, wherein the filling method is: Cartesian filling or radial filling or spiral filling, and the acceleration method is: one or any combination of half-Fourier acquisition, parallel acquisition, multi-layer simultaneous acquisition, and compressed sensing sparse acquisition.

In an exemplary embodiment, the high temporal resolution image reconstruction module 32 reconstructing an image of each phase with high temporal resolution, comprises: determining a reconstruction method according to the filling method and acceleration method used by the K-space data acquisition module 31 when acquiring K-space data of each phase with high temporal resolution, and using the determined reconstruction method to reconstruct an image of each phase with high temporal resolution;

the low temporal resolution image reconstruction module 33 subjecting K-space data obtained after averaging to image reconstruction, comprises: determining a reconstruction method according to the filling method and acceleration method used by the K-space data acquisition module 31 when acquiring K-space data of each phase with high temporal resolution, and using the determined reconstruction method to subject K-space data obtained after averaging to image reconstruction.

In an exemplary embodiment, the low temporal resolution image reconstruction module 33 subjecting adjacent K-space data of multiple phases with high temporal resolution acquired by the K-space data acquisition module 31 to summing and then averaging in a complex field, comprises: subjecting adjacent K-space data of multiple phases with high temporal resolution acquired by the K-space data acquisition module 31 to summing and then averaging in a complex field after phase correction and motion registration.

In an exemplary embodiment, the high temporal resolution scanning parameter value pre-inputted by the user and used by the K-space data acquisition module 31 is: an acquisition time interval of two adjacent phases when acquiring K-space data with high temporal resolution, and the acquisition time interval of two adjacent phases pre-inputted by the user remains unchanged throughout the period of acquiring K-space data with high temporal resolution, or increases as the delay time after contrast agent injection increases throughout the period of acquiring K-space data with high temporal resolution.

In an exemplary embodiment, the low temporal resolution reconstruction parameter value pre-inputted by the user and used as a basis by the low temporal resolution image reconstruction module 33 is: a time interval of two adjacent phases of a reconstructed low temporal resolution image, and the time interval of two adjacent phases of the reconstructed low temporal resolution image pre-inputted by the user remains the same in all reconstructed low temporal resolution phases, or increases as the delay time after contrast agent injection increases.

Embodiments of the present disclosure further provide magnetic resonance imaging (MRI) system 300, the MRI system may include the DCE-MRI reconstruction apparatus 30 according to the disclosure. The MRI system 300 may further include a MR scanner 35 that may include a main magnet unit which comprises a main magnet for generating the main magnet field and a cylindrical patient receiving space into which a patient can be moved by means of a patient support (not shown) for examination. The scanner 35 may also include a gradient coil arrangement and a radiofrequency coil arrangement that may surround the patient receiving space. The operation of the MRI system 300, including the operation of the scanner 35, may be controlled by the reconstruction apparatus 30 (e.g., functioning as a controller of the system).

Those skilled in the art will understand that features stated in embodiments and/or claims of the present disclosure can be combined and/or integrated in various ways, even if such combinations or integrations are not clearly stated in the present application. In particular, without departing from the spirit and teaching of the present application, features stated in embodiments and/or claims of the present application can be combined and/or integrated in various ways, and all such combinations and/or integrations fall within the scope of disclosure of the present application.

Specific embodiments have used herein to expound the principles and forms of implementation of the present application, but the description of the embodiments above is merely intended to help understand the method of the present application and the core idea thereof, not to restrict the present application. Those skilled in the art can make changes in terms of the specific form of implementation and the application scope, based on the idea, spirit and principles of the present application, and any modification, equivalent replacement or improvement, etc. that is made should be included in the scope of protection of the present application.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

The various components described herein may be referred to as "modules," "units," or "devices." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such modules, units, or devices, as applicable and relevant, may alternatively be referred to herein as "circuitry," "controllers," "processors," or "processing circuitry," or alternatively as noted herein.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

REFERENCE LIST

| | |
|---|---|
| 101-103 | Steps |
| 201 | Moment when injection of contrast agent begins |
| 21 | K-space data of 1 phase with high temporal resolution |
| 22 | K-space data of 1 phase with low temporal resolution |
| 30 | DCE-MRI reconstruction apparatus |
| 31 | K-space data acquisition module |
| 32 | High temporal resolution image reconstruction module |
| 33 | Low temporal resolution image reconstruction module |
| 35 | Scanner |
| 300 | MRI system |

The invention claimed is:

1. A dynamic contrast-enhanced magnetic resonance imaging reconstruction method, the method comprising:
acquiring, using a dynamic contrast-enhanced magnetic resonance imaging (DCE-MRI) sequence to scan an imaging target, and a received high temporal resolution scanning parameter value, K-space data of each phase with high temporal resolution in preparation of injection of a contrast agent and during injection thereof;
reconstructing, based on the acquired K-space data of each phase with high temporal resolution, an image of each phase with high temporal resolution; and
performing, based on a received low temporal resolution reconstruction parameter value and the high temporal resolution scanning parameter value used when acquiring K-space data of each phase with high temporal resolution:
summing and averaging, in a complex field, of adjacent K-space data of multiple phases with high temporal resolution; and

image reconstruction of K-space data obtained after averaging to obtain an image of each phase with low temporal resolution.

2. The method as claimed in claim 1, wherein the acquisition of the K-space data of each phase with high temporal resolution is based on:
a preset K-space data filling method that includes a Cartesian filling, a radial filling, or spiral filling; and
an acceleration method that includes a half-Fourier acquisition, a parallel acquisition, a multi-layer simultaneous acquisition, and/or compressed sensing sparse acquisition.

3. The method as claimed in claim 2, further comprising determining a reconstruction method according to the filling method and acceleration method used when acquiring K-space data of each phase with high temporal resolution, wherein:
reconstructing the image of each phase with high temporal resolution is based on the determined reconstruction method; and
the performing image reconstruction on the K-space data obtained after averaging is based on the determined reconstruction.

4. The method as claimed in claim 1, wherein summing and averaging, in the complex field, adjacent K-space data of multiple phases with high temporal resolution to summing and then averaging in a complex field is performed after phase correction and motion registration.

5. The method as claimed in claim 1, wherein the high temporal resolution scanning parameter value comprises: an acquisition time interval of two adjacent phases when acquiring K-space data with high temporal resolution, the acquisition time interval: remaining unchanged throughout acquisition of the K-space data with high temporal resolution, or increasing as a delay time after contrast agent injection increases throughout the acquisition of the K-space data with high temporal resolution.

6. The method as claimed in claim 1, wherein the low temporal resolution reconstruction parameter value comprises a time interval of two adjacent phases of a reconstructed low temporal resolution image, the time interval of two adjacent phases of the reconstructed low temporal resolution image: being constant in all reconstructed low temporal resolution phases, or increasing as a delay time after contrast agent injection increases.

7. The method as claimed in claim 1, wherein is high temporal resolution scanning parameter value is predetermined prior to acquisition of the K-space data.

8. The method as claimed in claim 1, wherein is high temporal resolution scanning parameter value is pre-inputted by a user.

9. A non-transitory computer-readable storage medium with an executable program stored thereon, that when executed, instructs a processor to perform the method of claim 1.

10. A dynamic contrast-enhanced magnetic resonance imaging reconstruction apparatus, comprising:
a K-space data acquisition module configured to, in preparation to inject a contrast agent and/or during injection thereof:
scan an imaging target using a dynamic contrast-enhanced magnetic resonance imaging (DCE-MRI) sequence to scan an imaging target, and
acquire K-space data of each phase with high temporal resolution using a high temporal resolution scanning parameter value;

a high temporal resolution image reconstruction module configured to reconstruct an image of each phase with high temporal resolution, based on the acquired K-space data of each phase with high temporal resolution; and a low temporal resolution image reconstruction module configured to:

in a complex field, sum and then average adjacent K-space data of multiple phases with high temporal resolution, based on: a low temporal resolution reconstruction parameter value, and the high temporal resolution scanning parameter value used when acquiring K-space data of each phase with high temporal resolution; and perform image reconstruction to K-space data obtained after averaging to obtain an image of each phase with low temporal resolution.

11. The apparatus as claimed in claim 10, wherein, to acquire K-space data of each phase with high temporal resolution, the K-space data acquisition module is further configured to use:

a preset K-space data filling method that includes a Cartesian filling, or a radial filling, or a spiral filling, and an acceleration method that includes a half-Fourier acquisition, a parallel acquisition, a multi-layer simultaneous acquisition, and/or a compressed sensing sparse acquisition.

12. The apparatus as claimed in claim 11, wherein:

the reconstructing the image of each phase with high temporal resolution by the high temporal resolution image reconstruction module, comprises: determining a reconstruction method according to the filling method and acceleration method used when acquiring K-space data of each phase with high temporal resolution, and using the determined reconstruction method to reconstruct an image of each phase with high temporal resolution; and performing, by the low temporal resolution image reconstruction module, image reconstruction on the K-space data obtained after averaging comprises: determining a reconstruction method according to the filling method and acceleration method used when acquiring K-space data of each phase with high temporal resolution, and using the determined reconstruction method to subject K-space data obtained after averaging to image reconstruction.

13. The apparatus as claimed in claim 10, wherein the low temporal resolution image reconstruction module is configured to sum and average the adjacent K-space data of multiple phases with high temporal resolution after phase correction and motion registration.

14. The apparatus as claimed in claim 10, wherein the high temporal resolution scanning parameter value comprises: an acquisition time interval of two adjacent phases when acquiring K-space data with high temporal resolution, the acquisition time interval of two adjacent phases remaining unchanged throughout the period of acquiring K-space data with high temporal resolution or increasing as a delay time after contrast agent injection increases throughout acquisition of the K-space data with high temporal resolution.

15. The apparatus as claimed in claim 10, wherein the low temporal resolution reconstruction parameter value comprises a time interval of two adjacent phases of a reconstructed low temporal resolution image, the time interval of two adjacent phases of the reconstructed low temporal resolution image remaining constant in all reconstructed low temporal resolution phases or increasing as a delay time after contrast agent injection increases.

16. A magnetic resonance (MR) imaging system comprising: the dynamic contrast-enhanced magnetic resonance imaging reconstruction apparatus as claimed in claim 10.

17. The system as claimed in claim 16, further comprising a MR scanner.

18. A dynamic contrast-enhanced magnetic resonance imaging reconstruction apparatus, comprising:

one or more processors; and memory storing instructions that, when executed by the one or more processors, cause the apparatus to:

acquire, using a dynamic contrast-enhanced magnetic resonance imaging (DCE-MRI) sequence to scan an imaging target, and a received high temporal resolution scanning parameter value, K-space data of each phase with high temporal resolution in preparation of injection of a contrast agent and during injection thereof;

reconstruct, based on the acquired K-space data of each phase with high temporal resolution, an image of each phase with high temporal resolution; and based on a received low temporal resolution reconstruction parameter value and the high temporal resolution scanning parameter value used when acquiring K-space data of each phase with high temporal resolution:

sum and average, in a complex field, of adjacent K-space data of multiple phases with high temporal resolution; and perform image reconstruction of K-space data obtained after averaging to obtain an image of each phase with low temporal resolution.

* * * * *